(12) United States Patent  (10) Patent No.: US 8,651,781 B2
Schwartzman                (45) Date of Patent:     Feb. 18, 2014

(54) TOOL RELEASE ACTUATING MECHANISM FOR HIGH SPEED ROTATING SPINDLE

(76) Inventor: Everett H. Schwartzman, Torrance, CA (US)

( * ) Notice: Subject to any disclaimer, the term of this patent is extended or adjusted under 35 U.S.C. 154(b) by 479 days.

(21) Appl. No.: 13/012,503

(22) Filed: Jan. 24, 2011

(65) Prior Publication Data

US 2011/0182688 A1    Jul. 28, 2011

Related U.S. Application Data

(60) Provisional application No. 61/298,160, filed on Jan. 25, 2010.

(51) Int. Cl.
*B23B 31/10*    (2006.01)

(52) U.S. Cl.
USPC .......................................... 409/233

(58) Field of Classification Search
USPC .......................................... 409/231, 232, 233
IPC ....................................................... B23B 31/10
See application file for complete search history.

(56) References Cited

U.S. PATENT DOCUMENTS

| | | | |
|---|---|---|---|
| 2,829,500 A | 4/1958 | Butler | |
| 4,265,141 A | 5/1981 | Bowman | |
| 4,875,404 A | 10/1989 | Aldridge | |
| 5,215,286 A | 6/1993 | Kolenc | |
| 5,253,671 A | 10/1993 | Kolenc | |
| 5,516,075 A | 5/1996 | Itoi et al. | |
| 5,980,172 A * | 11/1999 | Shoda | 409/203 |
| 6,179,533 B1 * | 1/2001 | Sun | 409/233 |
| 6,345,567 B1 | 2/2002 | Wilhelm Bakermans | |
| 7,287,941 B1 * | 10/2007 | Erickson | 409/233 |
| 7,303,176 B2 | 12/2007 | Tokuda et al. | |
| 2007/0290459 A1 * | 12/2007 | Kitaura et al. | 279/155 |

FOREIGN PATENT DOCUMENTS

| | | | | | |
|---|---|---|---|---|---|
| JP | 06226514 A | * | 8/1994 | ............ | B23B 31/117 |
| JP | 2008272898 A | * | 11/2008 | ............ | B23B 31/117 |

* cited by examiner

*Primary Examiner* — Daniel Howell
*Assistant Examiner* — Michael Vitale
(74) *Attorney, Agent, or Firm* — Novak Druce Connolly Bove + Quigg LLP

(57) ABSTRACT

A spindle assembly useful at high rotational speeds including a tool holding and releasing collet mechanism operated by an axially movable drawbar held in its tool holding position by a spring the force of which is overcome by a piston movable between first and second positions. A plurality of arms pivotally secured at one end thereof to a housing with a second end thereof engaging said piston and having a cam surface intermediate the first and second ends thereof engaging an actuator positioned to engage said drawbar, overcome said spring and move the collet mechanism to its tool releasing position. The ratio of the distance between the pivot point and cam surface with respect to the distance between the pivot point and the second end thereof being such to magnify the force of the piston sufficient to overcome the spring force.

7 Claims, 4 Drawing Sheets

TOOL RELEASE ACTUATING MECHANISM FOR HIGH SPEED ROTATING SPINDLE

This application is based upon provisional patent application No. 61/298,160 filed Jan. 25, 2010 and claims the benefit of the filing date of the provisional application.

FIELD OF THE INVENTION

This invention relates generally to high speed rotating spindles utilized for drilling or routing printed circuit boards and more specifically to an actuating mechanism utilized in such high speed rotating spindles for actuating a tool holding and releasing collet mechanism contained thereon.

BACKGROUND OF THE INVENTION

In the printed circuit board industry where spindles are employed for drilling or routing circuit boards, a drawbar secures a collet within which the drill or router bit is secured. A very strong spring is positioned within the spindle and applies sufficient force on the order of 400 to 800 pounds to secure the drill or router bit in the collet. This large amount of force is required to properly secure the tool bit and maintain its operational characteristics while the spindle is rotating at speeds as high as 350,000 RPM or greater, but may be operated at speeds as low as 2,000 RPM. The spindle structure may drive a drill as small as 4 mils in diameter or as large as ¼ of an inch in diameter. During operation, the drill or router bit must be changed from time to time and when such change occurs, a force must be applied to the drawbar sufficient to overcome the 400 to 800 pounds of axial force being applied by the spring.

In the prior art such high forces were obtained by using air pressure at approximately 400 pounds (PSIG) which was obtained by increasing shop air pressure which is approximately 65 to 125 PSIG and intensifying it. The machines, used for intensifying this air pressure are complicated pneumatic mechanical piston devices which are very noisy, unreliable and extremely expensive to maintain. As an alternative and where space permits a multitude of pistons or diaphragms may be arranged and employed in such spindles to overcome the force of the spring to release the tools. The utilization of such pistons and diaphragms causes the spindle to become quite long and heavy. Since these spindles in the printed circuit board industry produce many holes per minute, the spindle weight is important form an inertia standpoint. A need, therefore, exists for an actuating mechanism which is lower in weight and does not increase the size of the spindle and yet which will exert sufficient force to overcome the spring force to actuate the collet and release the tool being held by the collet.

SUMMARY OF THE INVENTION

A spindle assembly useful at high rotational speeds having a rotational shaft disposed within a housing and supported by spaced apart bearings which shaft carries a tool holding and releasing collet mechanism operated by an axially movable drawbar which is biased towards a first position by a spring to secure the tool in the collet. The improvement comprising an actuator engaging one end of the drawbar, a plurality of arms having one end pivotally secured to the housing, a piston disposed in the housing and movable between first and second positions and engaging the arms at the second end thereof, each of the arms including a cam surface intermediate the first and second ends engaging the actuator at a contact point and a source of gas under pressure connected to move the piston from the first position to the second position with the piston rotating the arms and applying force to the actuator at the contact point to overcome the bias of the spring to move the drawbar to open the collet to release the tool.

DETAILED DESCRIPTION OF THE DRAWINGS

Figure 1:
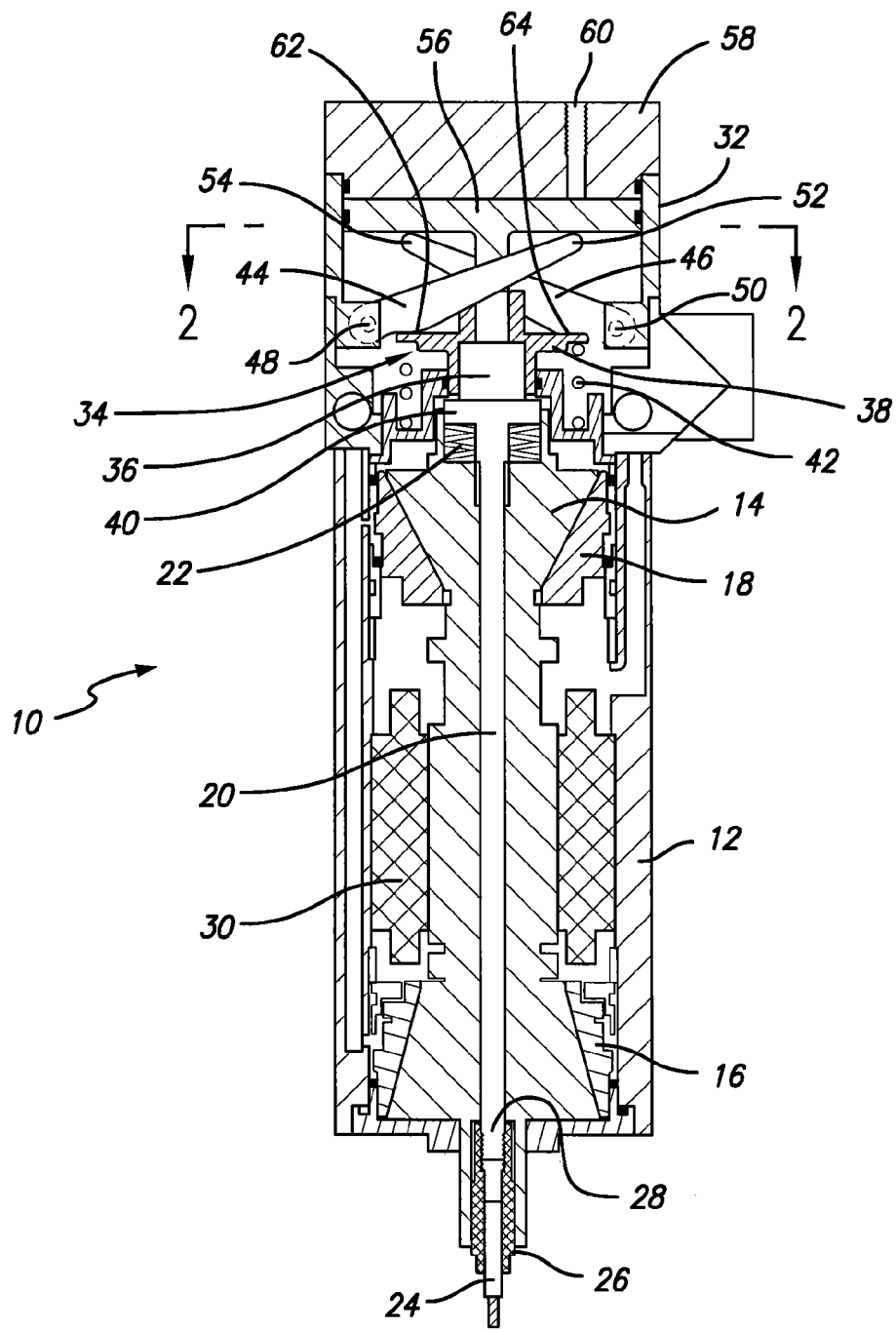
FIG. 1 is a cross-sectional view of a spindle constructed in accordance with the principles of the present invention.

High speed rotating spindles useful in the printed circuit industry are well known to those skilled in the art. One such spindle is illustrated and described in U.S. Pat. No. 4,884,899 with particular reference to FIG. 20 and the description thereof commencing at column 33 which by this reference is incorporated herein. The spring which is utilized for moving the drawbar to secure a drilling or routing tool therein is also well known in the art and one such example is illustrated and described in U.S. Pat. No. 4,913,605 which by this reference is incorporated herein. A high speed rotating spindle constructed in accordance with the principles of the present invention is illustrated in FIG. 1 at 10. Such spindle includes a housing 12 which contains a shaft 14 which is supported on a front bearing 16 and on a rear bearing 18. A drawbar 20 is contained within the shaft 14 and is axially movable between first and second positions. The drawbar is biased toward its first position by a first spring 22 and when in this position secures a tool 24 within a collet 26 which is disposed at the first end 28 of the drawbar 20. The shaft 14 is caused to rotate by an electrical motor, the stator of which is shown at 30. The upper portion 32 of the housing 12 contains the actuating mechanism which is the improvement in the spindle assembly according to the principles of the present invention. As is illustrated, an actuator 34 includes a non-galling member 36 received within a spring retaining member 38 which member 36 engages the second end 40 of the drawbar 20 when actuating the drawbar 20. A second spring 42 is received within the spring retaining member 38, the function of which will be described more fully below.

A pair of arms 44 and 46 are pivotally secured to the upper portion 32 of the housing by pins 48 and 50 respectively. The arm 44 has a second end 52 and the arm 46 has a second end 54. A piston 56 is slidably secured within the housing 32 and is movable between a first position as illustrated in FIG. 1 and a second position which is illustrated in FIG. 3 and will be described more fully below.

Figure 2:
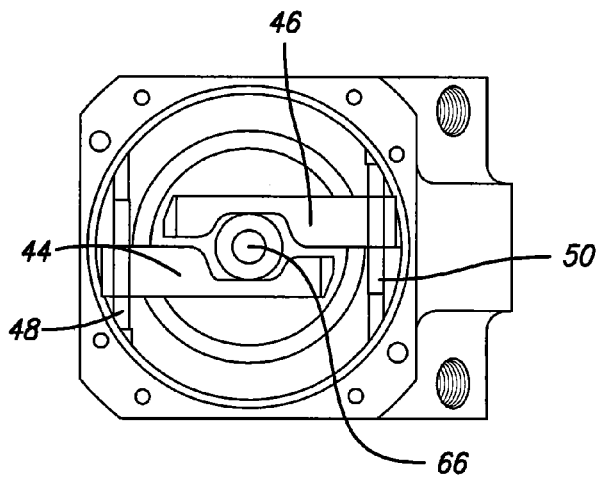
FIG. 2 is a view taken about the lines 2-2 of FIG. 1.

The top 58 of the housing includes a port 60 to which there is connected a source of gas under pressure such as air (not shown). The arm 44 includes a cam surface 62 positioned intermediate its first and second ends which cam surface 62 engages the spring retainer 38. The arm 46 includes a cam surface 64 disposed between its first and second ends which also engages the spring retainer 38. As is illustrated in FIG. 2, the arms 44 and 46 are disposed on opposite sides of the shaft 66 connected to the piston head 56.

Figure 3:
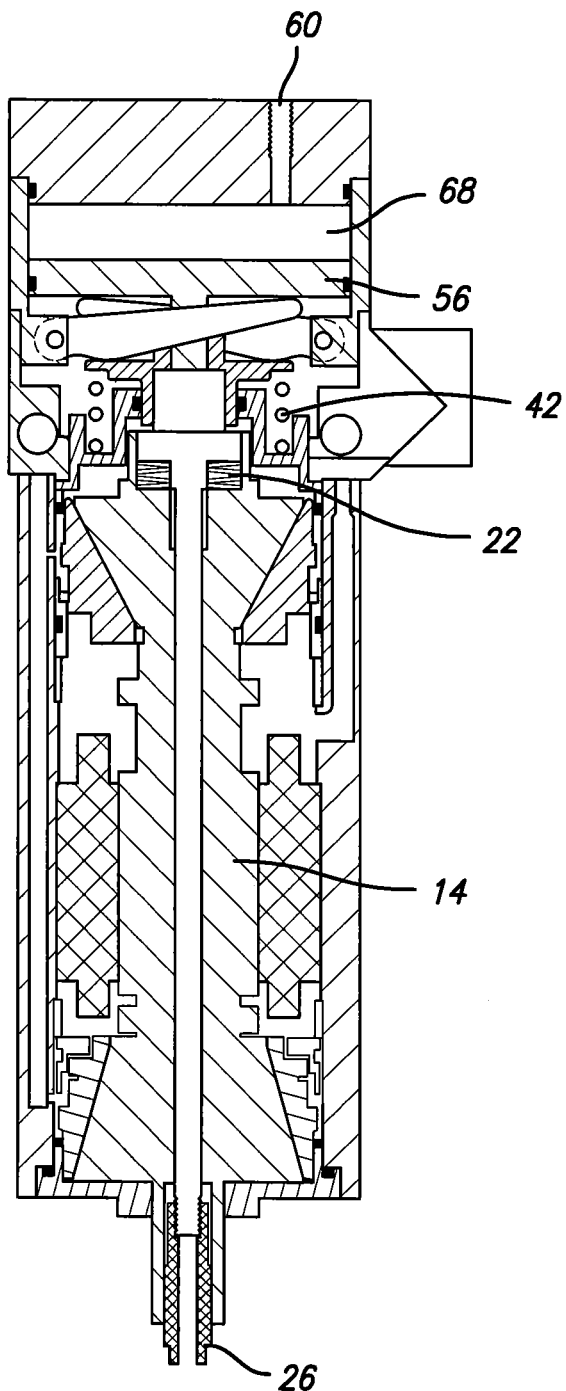
FIG. 3 is a view similar to FIG. 1 but illustrating the actuating mechanism of the present invention in its actuated position.

Referring now more specifically to FIG. 3 which is the structure illustrated in FIG. 1 in its actuated position and the parts referred to below use some of the numerals show in FIG. 1 as well as FIG. 3. When gas under pressure is applied through the port 60, it enters the cavity 68 and engages the piston 56 causing it to move downwardly as shown in FIG. 3. As the piston moves downwardly to the position shown in FIG. 3 the lower surface of the piston head 56 engaging the ends 52 and 54 of the arms 44 and 46, respectively, cause the arms to pivot about their respective pivot points 48 and 50 causing the cam surfaces to move on the top of the spring retainer 38 forcing it downwardly. The downward movement of the spring retainer 38 then causes the non-galling member 36 to engage the top of the drawbar 20 to move the drawbar 20 downwardly to its second position, as illustrated in FIG. 3, to overcome the pressure of the spring 22 to cause the collet 26 to open and allow the tool 24 to be released therefrom. It will be recognized by those skilled in the art that by utilizing the arms 44 and 46 in the manner as illustrated, the force which is generated by the gas under pressure being applied to the piston 56 is magnified according to the ratio of the distance between the pivot point and the cam surface contact point with respect to the distance of the lever arm from the pivot point to its end. The ratio of those distances is chosen such that the force which is increased through the utilization of the lever arm and the cam surfaces contacting the spring retainer will be sufficient to overcome the force of the first spring 22 to move the drawbar to its second position and release the tool from the collet. When the pressure is released and vented from the space 68 by shutting off the source of the gas under pressure therefrom, the spring 42 will, by exerting the force to the upper surface of the spring retainer and applying it against the cam surfaces, cause the arms to return to the position shown in FIG. 1 and move the piston upwardly accordingly thus again allowing the first spring 22 to secure a tool within the collet 26.

Figure 4:
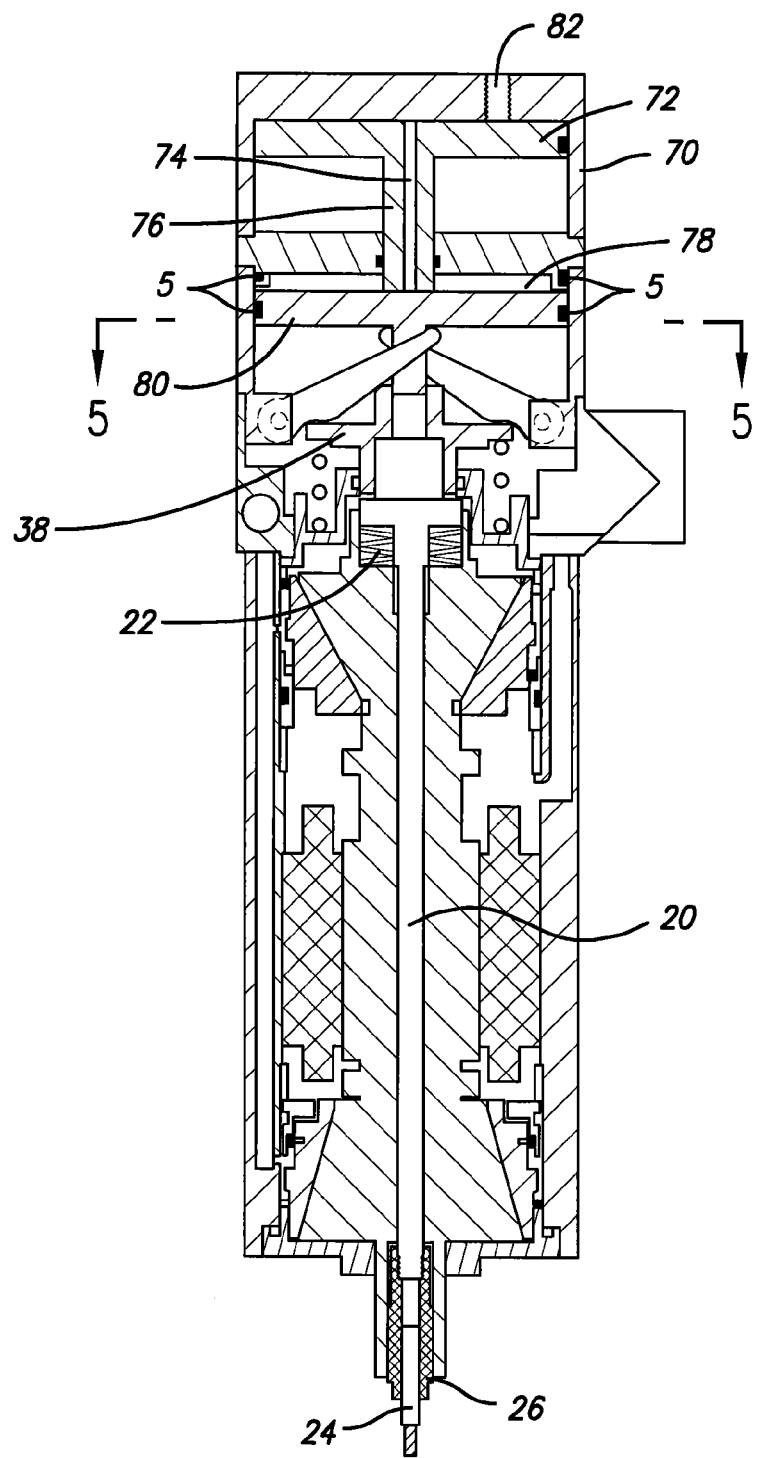
FIG. 4 is a cross sectional view similar to that of FIG. 1 but illustrating an alternative embodiment of an actuating mechanism in accordance with the present invention.

Referring now more particularly to FIG. 4, there is illustrated an alternative embodiment of an actuating mechanism constructed in accordance with the present invention. The structure as illustrated in FIG. 4 is identical to that as illustrated in FIG. 1 and the numerals used therein are the same. The additional portion of FIG. 4 which has been added is that there is an extension 70 of the housing and a second piston 72 is disposed therein. The second piston 72 has an orifice 74 in the piston rod 76 which communicates with the space 78 to act against the upper surface of the first piston 80. As a result when gas under pressure is applied through the port 82, it will act upon the piston 72 causing it to move downwardly and the gas under pressure will also pass through the orifice 74 into the space 78 thus adding the pressure to the upper surface of the piston 80 thus effectively doubling the force which is generated by the gas under pressure being applied to the pistons. The first piston 80 will interact by the engagement thereof with the upper ends of the lever arms causing them to move downwardly as above described so that the cam surfaces will move against the actuator causing the drawbar to move to its second position to overcome the force of the spring 22 to release the collet 26 and allow the tool 24 to be removed therefrom.

Figure 5:
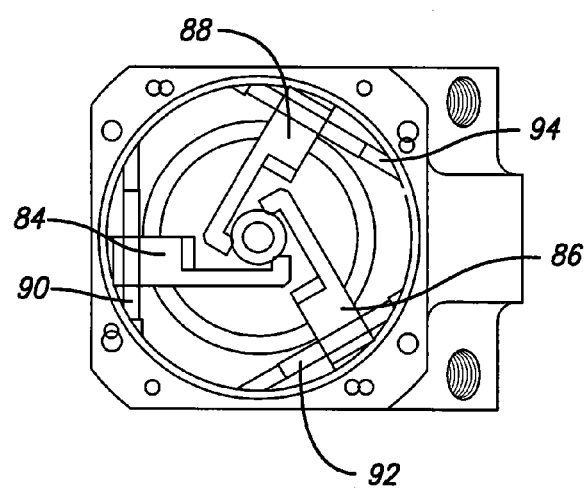
FIG. 5 is a view taken above the lines 5-5 of FIG. 4.

As is illustrated in FIG. 5, the structure in FIG. 4 may include three arms 84, 86 and 88 which are pivotally secured to the housing by pins 90, 92 and 94 respectively. By utilization of the three arms which are secured in the fashion as shown, the forces generated are more evenly distributed to the spring retainer 38 to cause the actuation as above described.

Figure 6:
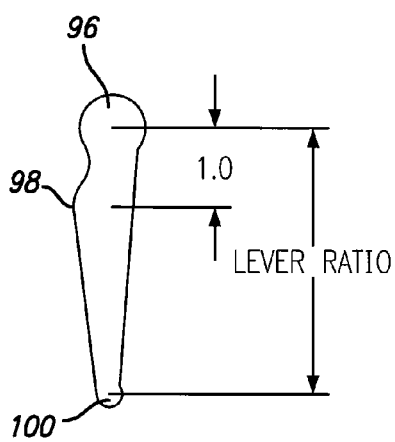
FIG. 6 is schematic view illustrating one form of lever arm which can be used in accordance with the principles of the invention.

As shown in FIG. 6, the lever ratio is determined by the distance between the point 96 where the arm is secured to the housing and the point 98 which contacts the spring retainer as compared to the distance between the point 96 and the point 100 of the arm which contacts the piston. That lever ratio may vary depending upon the force of the first spring 22 and the amount of force generated by the application of the gas under pressure to the piston, but in any event would be selected to be such that the force created through the use of the lever arms is sufficient to overcome the force of the first spring 22 and open the collet to release the two.

It has thus been described a tool release actuating mechanism for use with a high speed rotating spindle which magnifies the forces normally applied by air under pressure to a piston for actuating the collet to release the two therefrom.

What is claimed is:

1. A spindle assembly adapted for use at high rotational speeds and including a rotational shaft disposed within a housing and supported by spaced apart bearings which shaft carries a tool holding and releasing collet mechanism operated by a drawbar having first and second ends and axially movable between first and second positions and biased toward said first position by a first spring to secure a tool in said collet which is disposed at said first end of said drawbar, the improvement comprising:

an actuator for engaging said second end of said drawbar;
a plurality of arms having first and second ends, said first ends being pivotally secured to said housing;
a piston disposed in said housing and movable between first and second positions engaging said arms at said second end thereof;
each of said arms having a cam surface intermediate said first and second ends engaging said actuator at a contact point;
a source of gas under pressure connected to move said piston from said first position to said second position when applied to said piston, said piston rotating said arms about the pivotally secured position thereof when moving from said first position to said second position and applying a force to said actuator at said contact point to overcome the bias of said first spring and move said drawbar to said second position to open said collet to release said tool; and
the distance between where said first end of said arms are being pivotally secured to said housing and said contact point of said cam surface on said actuator compared to the distance between where said first end of said arms are being pivotally secured to said housing and said point where said piston engages the second end said arms defining a ratio which magnifies the force being applied by said piston to said actuator.

2. The improvement as defined in claim 1 which includes two arms.

3. The improvement as defined in claim 1 which includes three arms.

4. The improvement as defined in claim 1 which includes a second piston disposed in series with said first piston.

5. The improvement as defined in claim 4 wherein said source of gas is connected to be applied to said second piston and said second piston defines a port to apply said gas to said first piston.

6. The improvement as defined in claim 1 wherein said actuator includes a spring retaining member and which further includes a second spring disposed within said spring retaining member to bias toward its first position and to move said piston to said first position in the absence of gas under pressure being applied thereto.

7. The improvement as defined in claim 6 which further includes a non-galling member carried by said spring retaining member and engaging said drawbar.

\* \* \* \* \*